US012588565B2

(12) United States Patent
Lee

(10) Patent No.: US 12,588,565 B2
(45) Date of Patent: Mar. 24, 2026

(54) SEMICONDUCTOR DEVICE INCLUDING BONDING PADS AND METHOD FOR FABRICATING THE SAME

(71) Applicant: SK hynix Inc., Gyeonggi-do (KR)

(72) Inventor: Byung Ho Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 366 days.

(21) Appl. No.: 18/346,790

(22) Filed: Jul. 4, 2023

(65) Prior Publication Data

US 2024/0243081 A1     Jul. 18, 2024

(30) Foreign Application Priority Data

Jan. 17, 2023     (KR) ........................ 10-2023-0006464

(51) Int. Cl.
H01L 25/065 (2023.01)
H01L 23/00 (2006.01)

(52) U.S. Cl.
CPC .............. H01L 24/05 (2013.01); H01L 24/03 (2013.01); H01L 24/08 (2013.01); H01L 25/0657 (2013.01); *H01L 2224/03003* (2013.01); *H01L 2224/03614* (2013.01); *H01L 2224/05027* (2013.01); *H01L 2224/08058* (2013.01); *H01L 2224/08147* (2013.01); *H01L 2225/06503* (2013.01); *H01L 2924/1431* (2013.01); *H01L 2924/1434* (2013.01); *H01L 2924/351* (2013.01)

(58) Field of Classification Search
CPC ....... H01L 2224/08147; H01L 25/0657; H01L 2224/05027; H01L 2225/06503; H01L 2224/08123; H01L 2224/08145; H01L 2224/802; H01L 2224/80895; H01L 2224/80896
See application file for complete search history.

(56) References Cited

U.S. PATENT DOCUMENTS 9,136,259 B2     9/2015   Pratt
2021/0305181 A1  9/2021   Lin et al.
2022/0077105 A1*  3/2022   He .......................... H01L 24/80

* cited by examiner

*Primary Examiner* — Tucker J Wright
(74) *Attorney, Agent, or Firm* — IP & T GROUP LLP

(57)     ABSTRACT

A semiconductor device includes: a first semiconductor structure including a stacked structure of a first dielectric layer and a first bonding dielectric layer; a second semiconductor structure including a stacked structure of a second dielectric layer and a second bonding dielectric layer; and a bonding pad penetrating the stacked structure of the first dielectric layer and the first bonding dielectric layer, and the stacked structure of the second dielectric layer and the second bonding dielectric layer, wherein the first bonding dielectric layer and the second bonding dielectric layer contact each other, and a first width of a first portion of the bonding pad penetrating the first dielectric layer is greater than each of a second width of a second portion of the bonding pad penetrating the first bonding dielectric layer, and a third width of a third portion of the bonding pad penetrating the second bonding dielectric layer.

12 Claims, 9 Drawing Sheets

1

SEMICONDUCTOR DEVICE INCLUDING BONDING PADS AND METHOD FOR FABRICATING THE SAME

CROSS-REFERENCE TO RELATED APPLICATIONS

The present application claims priority of Korean Patent Application No. 10-2023-0006464, filed on Jan. 17, 2023, which is incorporated herein by reference in its entirety.

BACKGROUND

1. Field

Embodiments of the present disclosure relate to a semiconductor technology and, more particularly, to a semiconductor device including bonding pads, and to a method for fabricating the semiconductor device.

2. Description of the Related Art

Electronic products are required to be capable of processing high-capacity data while getting smaller and smaller in their volume. Accordingly, semiconductor structures used in those electronic products, such as semiconductor chips and wafers, are also required to have a thin thickness and a small size. Furthermore, a form of embedding a plurality of semiconductor structures in one semiconductor device is being realized.

A plurality of semiconductor structures may be stacked in a vertical direction and electrically connected to each other using bonding pads.

SUMMARY

Embodiments of the present disclosure are directed to a semiconductor device that may have improved bonding characteristics and heat dissipation characteristics through bonding pads in a structure of coupling two semiconductor structures with the bonding pads, and that may be capable of preventing a defect in connection between the bonding pads while reducing the resistance of an electrical path through the bonding pads is, and a method for fabricating the same.

In accordance with an embodiment of the present disclosure, a semiconductor device includes: a first semiconductor structure including a stacked structure of a first dielectric layer and a first bonding dielectric layer positioned over the first dielectric layer; a second semiconductor structure including a stacked structure of a second dielectric layer and a second bonding dielectric layer positioned over the second dielectric layer; and a bonding pad passing through the stacked structure of the first dielectric layer and the first bonding dielectric layer, and the stacked structure of the second dielectric layer and the second bonding dielectric layer, wherein the first bonding dielectric layer and the second bonding dielectric layer contact each other, and a first width of a first portion of the bonding pad passing through the first dielectric layer is greater than each of a second width of a second portion of the bonding pad passing through the first bonding dielectric layer, and a third width of a third portion of the bonding pad passing through the second bonding dielectric layer.

In accordance with another embodiment of the present disclosure, a method for fabricating a semiconductor device includes: providing a first semiconductor structure including a stacked structure of a first dielectric layer and a first bonding dielectric layer, and including a first opening having a first width in the first dielectric layer and a second opening having a second width smaller than the first width in the first bonding dielectric layer, and overlapping with the first opening; providing a second semiconductor structure including a stacked structure of a second dielectric layer and a second bonding dielectric layer, and an initial bonding pad passing through the second dielectric layer and the second bonding dielectric layer while having a protruding portion which protrudes from the second bonding dielectric layer; and bonding the first bonding dielectric layer and the second bonding dielectric layer while inserting the protruding portion into the first and second openings.

DETAILED DESCRIPTION

Figure 1A:
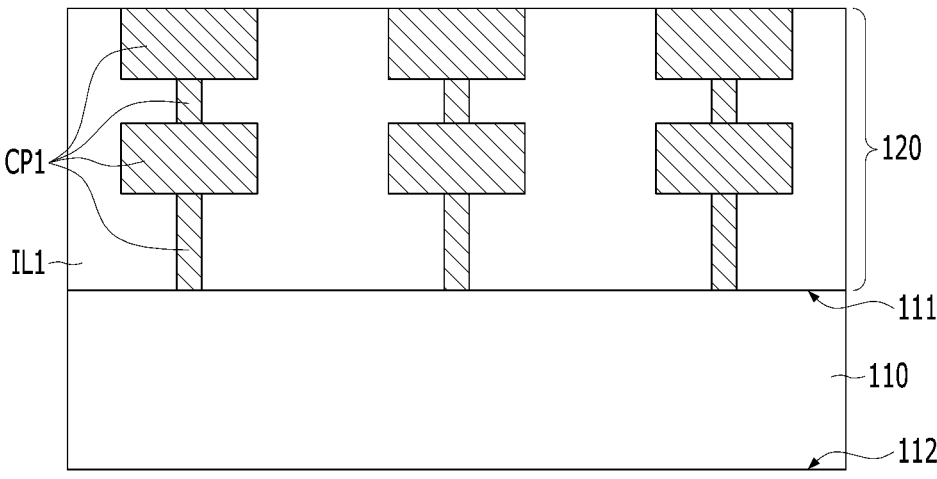
FIGS. 1A to 1D are cross-sectional views illustrating a first semiconductor structure and a method for fabricating the same in accordance with an embodiment of the present disclosure.

Embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following description, a semiconductor structure includes a semiconductor wafer, a semiconductor chip, and the like including an integrated circuit that performs a predetermined function. Also, a semiconductor device may include two or more semiconductor structures that are stacked in a vertical direction and electrically connected to each other. Two or more semiconductor structures may be coupled using bonding pads.

Figure 1B:
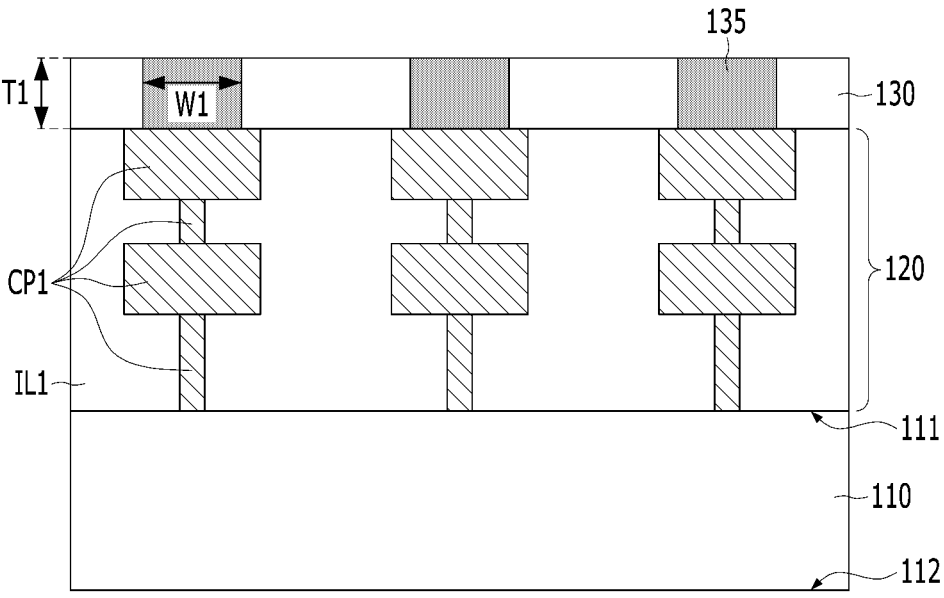
Figure 1C:
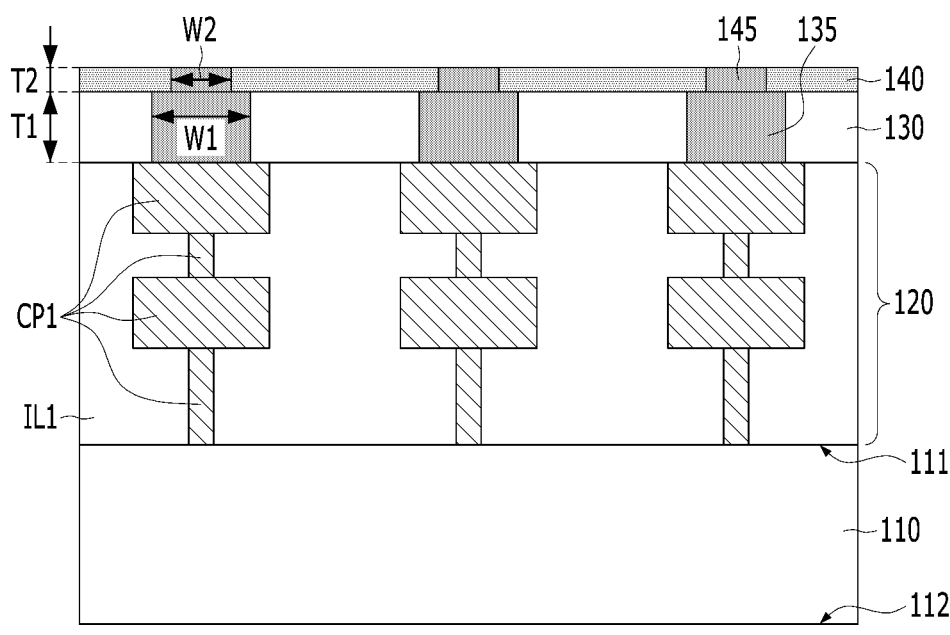
Figure 1D:
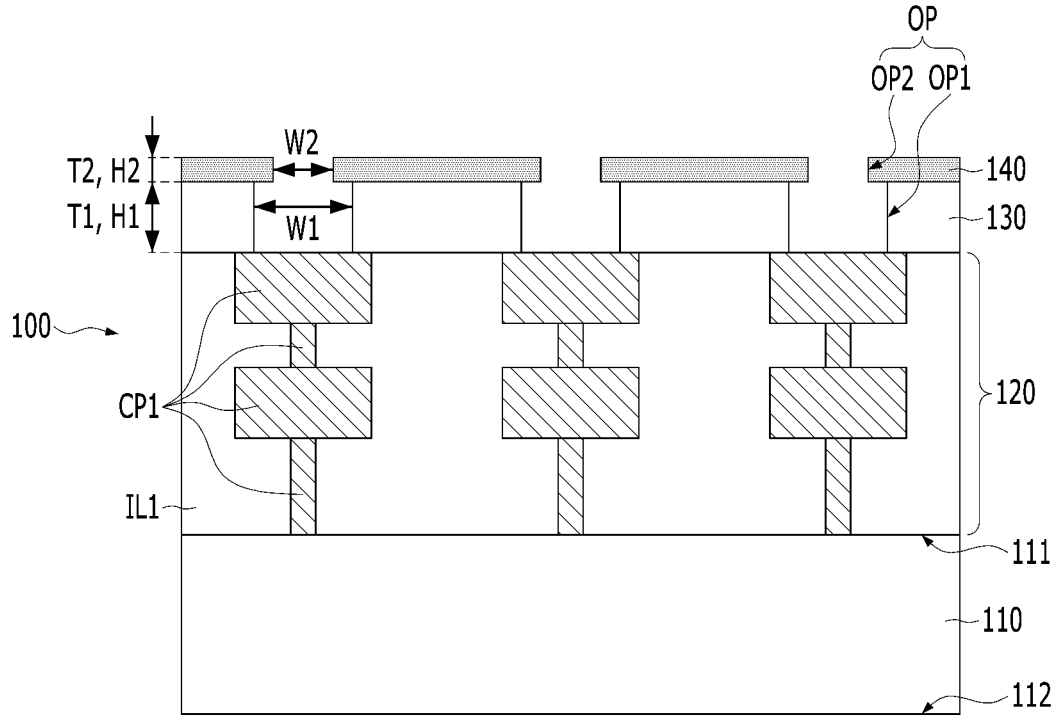

FIGS. 1A to 1D are cross-sectional views illustrating a first semiconductor structure and a method for fabricating the same in accordance with an embodiment of the present disclosure. FIG. 1D shows a first semiconductor structure in accordance with an embodiment of the present disclosure, and FIGS. 1A to 1C show intermediate processes for fabricating the first semiconductor structure shown in FIG. 1D.

First, the fabrication method will be described.

Referring to FIG. 1A, a first semiconductor substrate 110 may be provided.

The first semiconductor substrate 110 may be made of a semiconductor material, such as silicon or germanium, and may have a front surface 111, a rear surface 112, and side surfaces coupling them to each other. The front surface 111 may correspond to an active surface on which the first circuit zone 120 is positioned. The rear surface 112 may correspond to an inactive surface positioned opposite to the front surface 111. The first semiconductor substrate 110 may be positioned in such a manner that the front surface 111 faces upward and the rear surface 112 faces downward.

Subsequently, the first circuit zone 120 may be formed on the front surface 111 of the first semiconductor substrate 110.

The first circuit zone 120 may include an integrated circuit CP1 that is configured to perform various functions including, for example, data storage and data processing. The integrated circuit CP1 may combine and electrically connect diverse discrete elements. The first circuit zone 120 may further include a dielectric layer IL1 in which the integrated circuit CP1 is buried. The dielectric layer IL1 may be formed directly on the front surface 111 of the first semiconductor substrate 110. The elements making the integrated circuit 120 may include active elements, such as transistors, passive elements, such as resistors and capacitors, and the like. For the sake of convenience in description, the constituent elements forming the integrated circuit CP1 are illustrated as a plurality of conductive patterns, such as combinations of conductive lines and conductive vias, that are stacked vertically from the front surface 111 of the first semiconductor substrate 110 and are spaced apart from each other along a horizontal direction parallel to the plane of the front surface 111. However, the present disclosure is not limited to the illustrated one, and the integrated circuit CP1 may be realized in diverse ways according to the type of the first semiconductor structure. For example, when the first semiconductor structure includes a volatile memory, such as a DRAM (Dynamic Random Access Memory), an SRAM (Static RAM), or a non-volatile memory, such as a NAND flash, an RRAM (Resistive RAM), a PRAM (Phase-change RAM), an MRAM (Magneto-resistive RAM), and an FRAM (ferroelectric RAM), the integrated circuit CP1 may include a memory cell array including a plurality of memory cells. Also, for example, when the first semiconductor structure is a logic chip or a controller including a peripheral circuit for driving a memory, the integrated circuit CP1 may include a peripheral circuit. The first circuit zone 120 may be formed through a typical semiconductor fabrication process, such as deposition of a conductive material and/or a dielectric material, doping, patterning, and polishing.

Referring to FIG. 1B, a first dielectric layer 130 and a first sacrificial pattern 135 may be formed over the first circuit zone 120.

The first dielectric layer 130 may provide a space in which some bonding pads of the first semiconductor structure are to be formed. The first dielectric layer 130 may be made of diverse dielectric materials, such as silicon oxide, silicon nitride, or a combination thereof. The first sacrificial pattern 135 may fill spaces formed in the first dielectric layer 130 and may be made of diverse materials having an etching rate that is different from that of the first dielectric layer 130. For example, when the first dielectric layer 130 is made of silicon oxide, the first sacrificial pattern 135 may be made of silicon nitride, or when the first dielectric layer 130 is made of silicon nitride, the first sacrificial pattern 135 may be made of silicon oxide. In some embodiments, the first sacrificial pattern 135 may further include a carbon-containing material, such as amorphous carbon. Since the bonding pad may be electrically connected to the integrated circuit CP1, the first sacrificial pattern 135 may be positioned to contact the integrated circuit CP1 for this purpose. For example, as shown in FIG. 1B, three first sacrificial patterns 135 may be positioned to respectively overlap with three corresponding conductive patterns which are positioned on top of the integrated circuit CP1 and arranged to be spaced apart from each other in the horizontal direction. However, the present disclosure is not limited thereto, and the number or arrangement of the first sacrificial patterns 135 may be varied. The width of the first sacrificial pattern 135 in the horizontal direction is indicated by a reference numeral W1, and this will be referred to as a first width W1, hereinafter. Also, the thickness of the first dielectric layer 130 and the first sacrificial pattern 135 in the vertical direction is indicated by a reference numeral T1, and this will also be referred to as a first thickness T1 hereinafter.

The first dielectric layer 130 and the first sacrificial pattern 135 may be formed by depositing a dielectric material over the first circuit zone 120, selectively etching the deposited dielectric material to provide spaces where portions of bonding pads are to be formed, and filling the spaces with a sacrificial material. Also, the first dielectric layer 130 and the first sacrificial pattern 135 may be formed by depositing a sacrificial material over the first circuit zone 120, selectively etching the sacrificial material to form the first sacrificial pattern 135, and then filling the space between the first sacrificial patterns 135 with a dielectric material.

Referring to FIG. 1C, a first bonding dielectric layer 140 and a second sacrificial pattern 145 may be formed over the first dielectric layer 130 and the first sacrificial pattern 135.

The first bonding dielectric layer 140 may provide a plurality of spaced apart spaces in which corresponding bonding pads of the first semiconductor structure are to be formed together with the first dielectric layer 130. In other words, the first dielectric layer 130 may provide parts of the spaces where the bonding pads of the first semiconductor structure are to be formed, and the first bonding dielectric layer 140 may provide the remaining parts of the spaces where the bonding pads of the first semiconductor structure are to be formed. Also, the first bonding dielectric layer 140 may be directly bonded to the second bonding dielectric layer of a second semiconductor structure, which is described later, to form a hybrid bonding structure. The first bonding dielectric layer 140 may be made of diverse dielectric materials that may be combined with the second bonding dielectric layer by covalent bonding between dielectric materials. For example, the first bonding dielectric layer 140 may include silicon oxide, silicon nitride, or a combination thereof. The first bonding dielectric layer 140 may be formed of a different material or the same material as that of the first dielectric layer 130.

The second sacrificial pattern 145 may fill the spaces formed in the first bonding dielectric layer 140 and may include diverse materials having an etching rate that is different from those of the first dielectric layer 130 and the first bonding dielectric layer 140. For example, when the first dielectric layer 130 and the first bonding dielectric layer 140 are made of silicon oxide, the second sacrificial pattern 145 may be made of silicon nitride, or when the first dielectric layer 130 and the first bonding dielectric layer 140 are made of silicon nitride, the second sacrificial pattern 145 may be made of silicon oxide. Also, for example, the second sacrificial pattern 145 may further include a carbon-containing material, such as amorphous carbon. The second sacrificial pattern 145 may be formed of the same material as that of the first sacrificial pattern 135. Also, the second sacrificial patterns 140 may be arranged to overlap with the first sacrificial patterns 135. In other words, the second sacrificial patterns 140 may directly contact the first sacrificial patterns 135 over the first sacrificial pattern 135. The width of the second sacrificial pattern 145 in the horizontal direction is indicated by a reference numeral W2, and this will be referred to as a second width W2, hereinafter. The thickness of the second sacrificial pattern 145 in the vertical direction is indicated by a reference numeral T2, and this will be referred to as a second thickness T2, hereinafter. Here, the second width W2 of the second sacrificial pattern 145 may be smaller than the first width W1 of the first sacrificial pattern 135. Furthermore, the second thickness T2 of the second sacrificial pattern 145 may be smaller than the first thickness T1 of the first sacrificial pattern 135.

The first bonding dielectric layer 140 and the second sacrificial pattern 145 may be formed by depositing a dielectric material over the first dielectric layer 130 and the first sacrificial pattern 135, selectively etching the dielectric material to form a space where the rest part of the bonding pad is to be formed, filling the space with a sacrificial material. Also, the first bonding dielectric layer 140 and the second sacrificial pattern 145 may be formed by depositing a sacrificial material over the first dielectric layer 130 and the first sacrificial pattern 135, selectively etching the sacrificial material to form the second sacrificial pattern 145, and filling the space between the second sacrificial patterns 145 with a dielectric material.

Referring to FIG. 1D, the first and second sacrificial patterns 135 and 145 may be selectively removed. The removal process may be performed using a gas or chemical having a higher etching rate with respect to the first and second sacrificial patterns 135 and 145 than those the first dielectric layer 130 and the first bonding dielectric layer 140.

As a result of this process, openings OP corresponding to spaces in which bonding pads of the first semiconductor structure are to be formed may be formed in the first dielectric layer 130 and the first bonding dielectric layer 140.

Each opening OP may include a first opening OP1 that is formed in the first dielectric layer 130 and a second opening OP2 that is formed in the first bonding dielectric layer 140. Since the first opening OP1 corresponds to the space from which the first sacrificial pattern 135 is removed, the first opening OP1 may have a first height H1 corresponding to the first width W1 and the first thickness T1. Since the second opening OP2 corresponds to the space from which the second sacrificial pattern 145 is removed, the second opening OP2 may have a second height H2 corresponding to the second width W2 which is smaller than the first width W1 and the second thickness T2 which is smaller than the first thickness T1. However, during the etching process, parts of the first bonding dielectric layer 140 and the first dielectric layer 130 may be lost. Thus, the first width W1 and the second width W2 may be enlarged.

As a result of the process described above, the first semiconductor structure 100 shown in FIG. 1D may be formed.

Referring back to FIG. 1D, the first semiconductor structure 100 may include a first semiconductor substrate 110, a first circuit zone 120 over the first semiconductor substrate 110, a first dielectric layer 130 over the first circuit zone 120, and a first bonding dielectric layer 140 over the first dielectric layer 130.

The first dielectric layer 130 may have the first openings OP1, and the first bonding dielectric layer 140 may have the second openings OP2. Each of the first openings OP1 may be integrated with a corresponding one of the second openings OP2 to form the openings OP. Each of the openings OP may provide a space in which a bonding pad of the first semiconductor structure 100 is to be formed.

Here, the first width W1 and the first height H1 of the first opening OP1 may be greater than the second width W2 and the second height H2 of the second opening OP2, respectively.

Figure 2A:
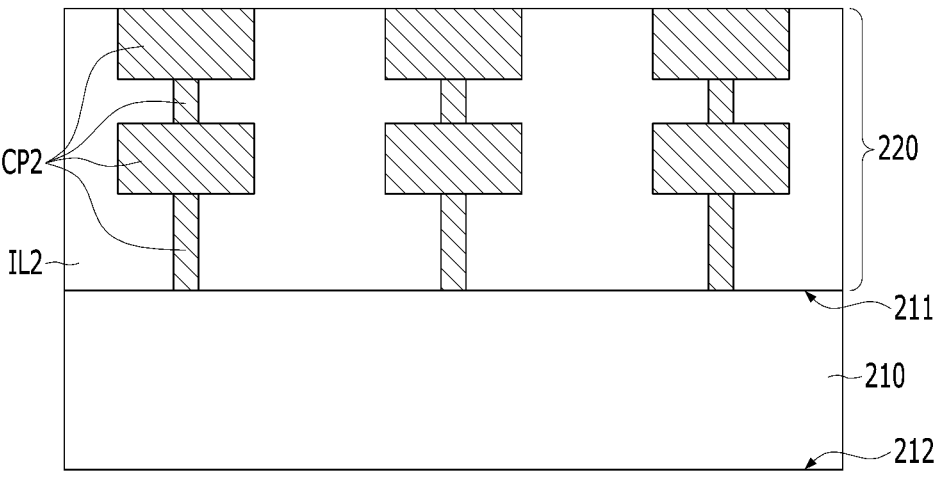
FIGS. 2A to 2D are cross-sectional views illustrating a second semiconductor structure and a method for forming the same in accordance with an embodiment of the present disclosure.
Figure 2B:
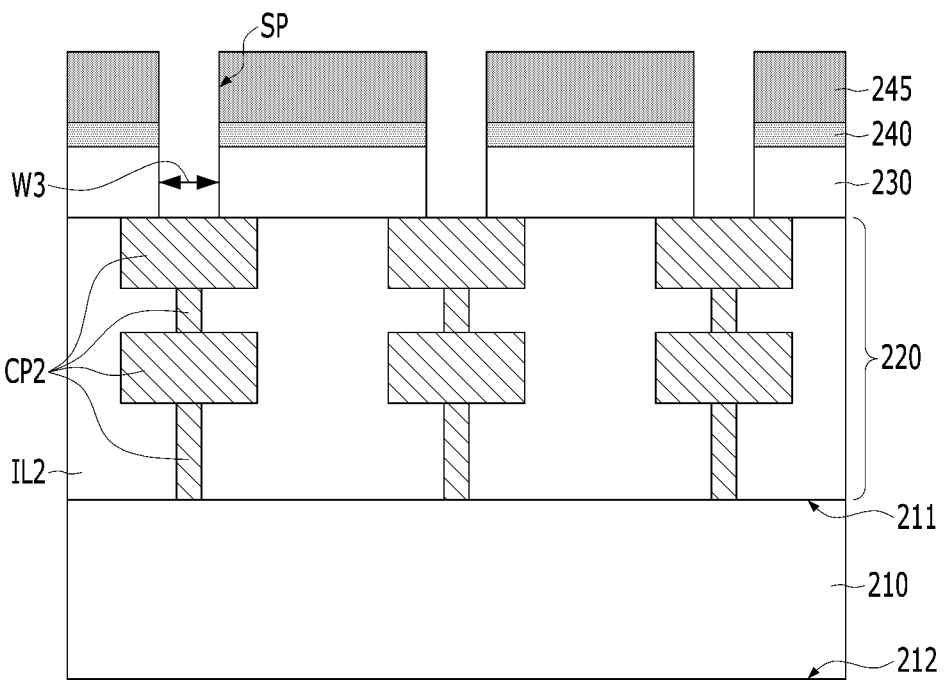
Figure 2C:
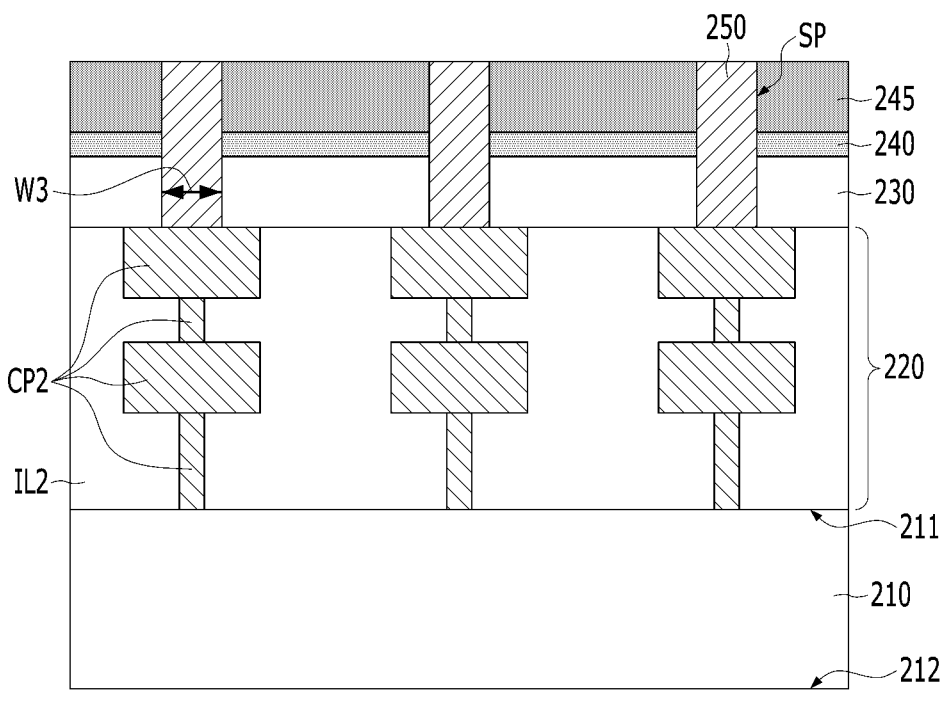
Figure 2D:
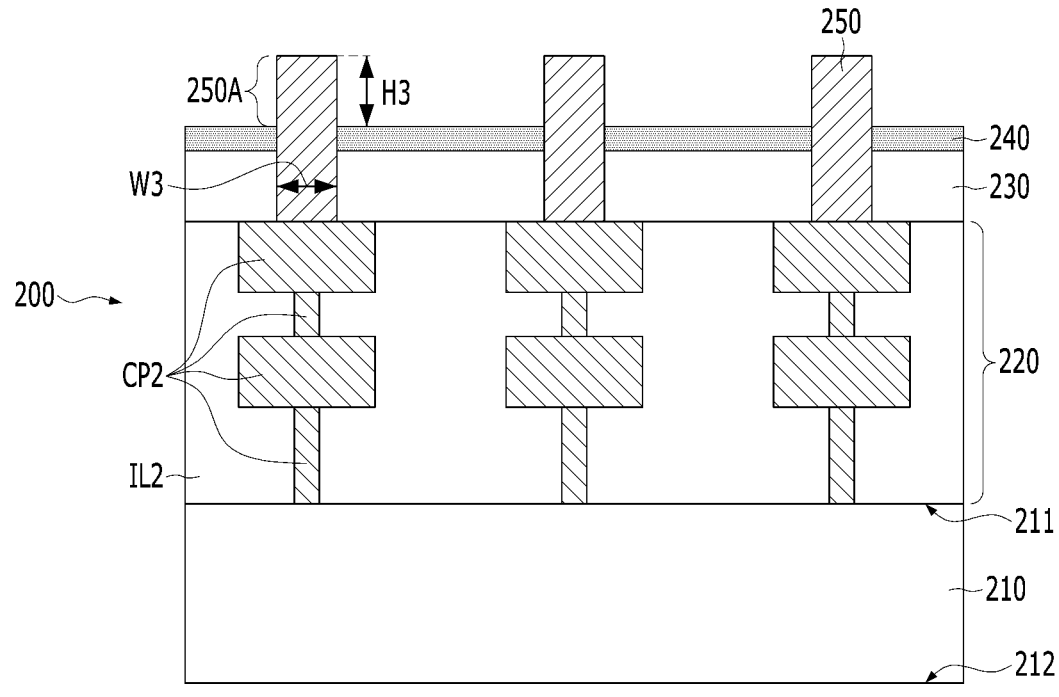

FIGS. 2A to 2D are cross-sectional views illustrating a second semiconductor structure and a method for fabricating the same in accordance with an embodiment of the present disclosure. FIG. 2D shows the second semiconductor structure in accordance with the embodiment of the present disclosure, and FIGS. 2A to 2C show intermediate process steps for forming the second semiconductor structure shown in FIG. 2D.

First, the method for forming the second semiconductor structure will be described.

Referring to FIG. 2A, a second semiconductor substrate 210 may be provided.

The second semiconductor substrate 210 may be made of a semiconductor material, such as silicon or germanium, and the second semiconductor substrate 210 may have a front surface 211, a rear surface 212, and side surfaces coupling the front surface 211 and the rear surface 212 to each other. The front surface 211 may correspond to an active surface on which a second circuit zone 220 is positioned, and the rear surface 212 may correspond to an inactive surface positioned opposite to the front surface. The second semiconductor substrate 210 may be positioned in such a manner that the front surface 211 faces upward and the rear surface 212 faces downward.

Subsequently, the second circuit zone 220 may be formed on the front surface 211 of the second semiconductor substrate 210.

The second circuit zone 220 may include an integrated circuit CP2 that is configured to perform various functions, such as data storage and data processing, by combining and electrically connecting diverse individual elements, and a dielectric layer IL2 in which the integrated circuit CP2 is embedded. The individual elements may include active elements, such as transistors, passive elements, such as resistors and capacitors, and the like. For the sake of convenience in description, the constituent elements forming the integrated circuit CP2 are illustrated as a plurality of conductive patterns, such as combinations of conductive lines and conductive vias, that are stacked vertically from the front surface 211 of the second semiconductor substrate 210 and arranged in a horizontal direction. However, the present disclosure is not limited to the illustrated one, and the integrated circuit CP2 may be realized in diverse ways according to the type of the second semiconductor structure. For example, when the second semiconductor structure includes a volatile memory, such as a DRAM (Dynamic Random Access Memory) and an SRAM (Static RAM), or a non-volatile memory, such as a NAND flash, an RRAM (Resistive RAM), a PRAM (Phase-change RAM), an MRAM (Magneto-resistive RAM), and an FRAM (ferro-electric RAM), the integrated circuit CP2 may include a memory cell array including a plurality of memory cells. Also, for example, when the second semiconductor structure is a logic chip or a controller including a peripheral circuit for driving a memory, the integrated circuit CP2 may include the peripheral circuit. The second circuit zone 220 may be formed through a typical semiconductor fabrication process, such as deposition of a conductive material and/or a dielectric material, ion implantation, patterning, and polishing. The second semiconductor structure may include a memory of the same type as that of the first semiconductor structure described above or a memory of a different type. Also, one among the first semiconductor structure and the second semiconductor structure may include a memory, and the other may include a peripheral circuit for driving the memory.

Referring to FIG. 2B, a second dielectric layer 230, a second bonding dielectric layer 240, and a sacrificial layer 245 may be formed over the second circuit zone 220.

The second dielectric layer 230, the second bonding dielectric layer 240, and the sacrificial layer 245 may provide a space in which a bonding pad of the second semiconductor structure are to be formed. In other words, the second dielectric layer 230 may provide a part of the space where the bonding pad of the second semiconductor structure is to be formed, and the second bonding dielectric layer 240 may provide another part of the space where the bonding pad of the second semiconductor structure is to be formed, and the sacrificial layer 245 may provide the rest part of the space where the bonding pad of the second semiconductor structure is to be formed. The second dielectric layer 230 may include diverse dielectric materials, such as silicon oxide, silicon nitride, or a combination thereof. The second bonding dielectric layer 240 may be directly bonded to the first bonding dielectric layer of the above-described first semiconductor structure to form a hybrid bonding structure, and the second bonding dielectric layer 240 may include diverse dielectric materials that may be combined with the first bonding dielectric layer by a covalent bonding between dielectric materials. For example, the second bonding dielectric layer 240 may include silicon oxide, silicon nitride, or a combination thereof. The second bonding dielectric layer 240 may be formed of a different material from or the same material as that of the second dielectric layer 230. The sacrificial layer 245 may include diverse materials having different etching rates from those of the second dielectric layer 230 and the second bonding dielectric layer 240. For example, when the second dielectric layer 230 and the second bonding dielectric layer 240 include silicon oxide, the sacrificial layer 245 may be made of silicon nitride, or the second dielectric layer 230 and the second bonding dielectric layer 240 may be made of silicon nitride, the sacrificial layer 245 may be made of silicon oxide. Also, for example, the sacrificial layer 245 may further include a carbon-containing material, such as amorphous carbon.

Subsequently, the second dielectric layer 230, the second bonding dielectric layer 240, and the sacrificial layer 245 may be selectively etched to form spaces SP in which the bonding pad of the second semiconductor structure is to be formed. Since each of the bonding pads may be electrically connected to a corresponding integrated circuit CP2, a corresponding space SP may be formed to expose the upper surface of the integrated circuit CP2. For example, as illustrated in FIG. 2B three spaces SP may be positioned to expose three conductive patterns that are positioned at the top of the integrated circuit CP2 and arranged to be spaced apart from each other in the horizontal direction. However, the present disclosure is not limited thereto, and the number or arrangement of the spaces SP may be diversely modified.

The width of the space SP in the horizontal direction is indicated by a reference numeral W3, and this will be referred to as a third width W3 hereinafter. The third width W3 may have a value equal to or less than the aforementioned second width (see W2 in FIG. 1D).

Referring to FIG. 2C, initial bonding pads 250 may be formed by filling the spaces SP with a conductive material. The bottom surface of each of the initial bonding pads 250 may contact and may be electrically connected to the uppermost conductive pattern of a corresponding one of the integrated circuit CP2.

The conductive material for forming each of the initial bonding pads 250 may be any suitable conductive material including, for example, a metal or a metal compound. For example, a suitable material for the initial bonding pad 250 may include at least one among copper (Cu), nickel (Ni), tin (Sn), gold (Au), and silver (Ag), or a compound of the metal.

The initial bonding pad 250 may be formed by forming a conductive material in a thickness that may sufficiently fill the space SP over the process result shown in FIG. 2B and then performing a planarization process, for example, Chemical Mechanical Polishing (CMP), until the upper surface of the sacrificial layer 245 is exposed.

Referring to FIG. 2D, the sacrificial layer 245 may be selectively removed. This removal process may be performed using a gas or chemical having a higher etching rate with respect to the sacrificial layer 245 than those of the second dielectric layer 230 and the second bonding dielectric layer 240.

As a result of this process, the initial bonding pad 250 may have a shape where a part is buried in the second dielectric layer 230 and the second bonding dielectric layer 240 and the rest protrudes out of the second bonding dielectric layer 240. The protruding portion of the initial bonding pad 250 will hereinafter be referred to as a protruding portion 250A. The height of the protruding portion 250A is indicated by a reference numeral H3, and this will be referred to as a third height H3 hereinafter.

As a result of the process described above, the second semiconductor structure 200 shown in FIG. 2D may be formed.

Referring again to FIG. 2D, the second semiconductor structure 200 may include a second semiconductor substrate 210, a second circuit zone 220 over the second semiconductor substrate 210, a second dielectric layer 230 over the second circuit zone 220, and a second bonding dielectric layer 240 over the second dielectric layer 230, and an initial bonding pad 250 including a protruding portion 250A protruding over the second bonding dielectric layer 240 while passing through the second dielectric layer 230 and the second bonding dielectric layer 240.

Each of the initial bonding pads 250 may have a third width W3, and the protruding portion 250A of the initial bonding pad 250 may have a third height H3.

By bonding the first semiconductor structure 100 and the second semiconductor structure 200 described above, a semiconductor device in which the first semiconductor structure 100 and the second semiconductor structure 200 are stacked may be realized. This will be described in more detail below with reference to FIGS. 3 and 4.

Figure 3:
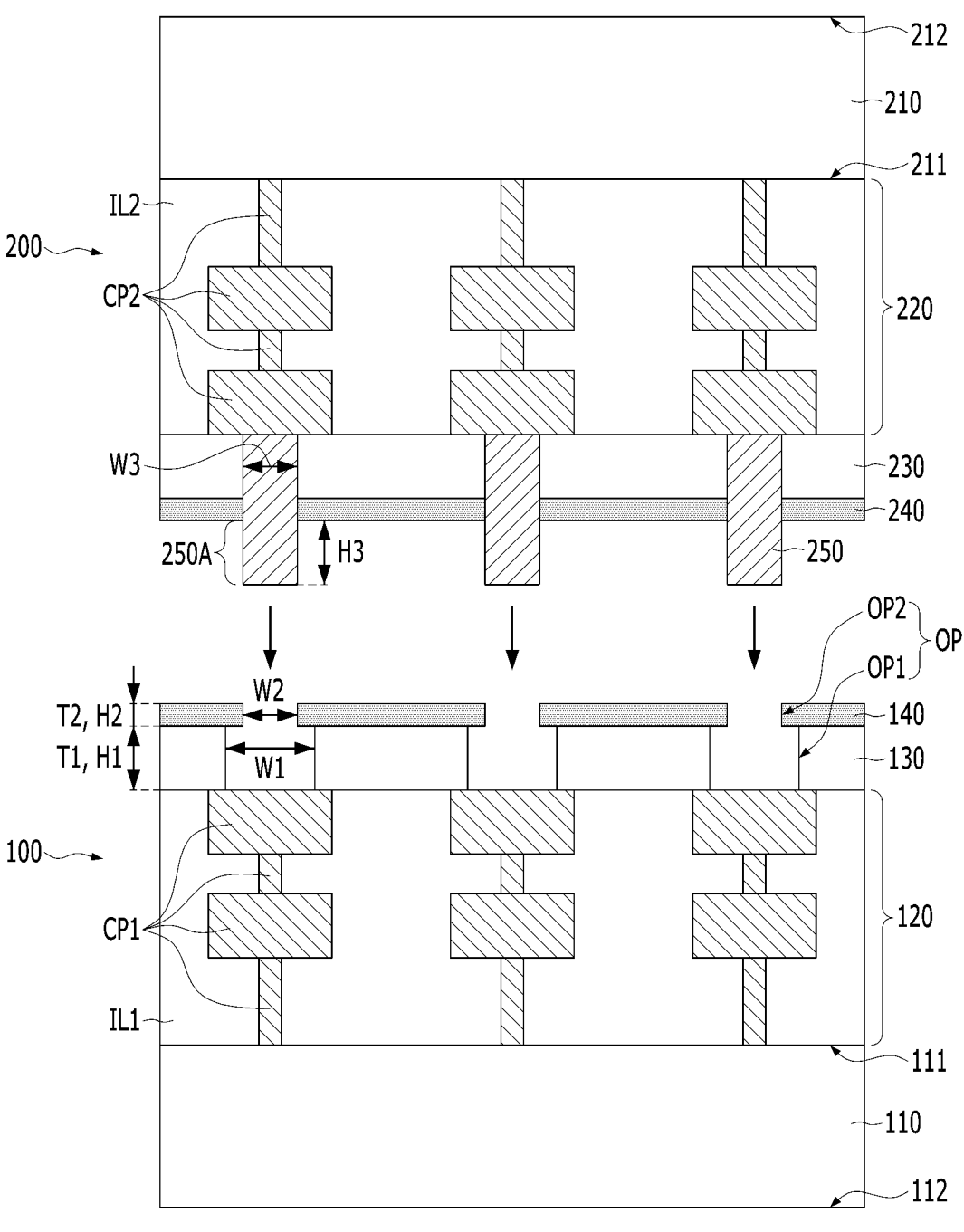
FIGS. 3 and 4 are cross-sectional views illustrating a semiconductor device and a method for fabricating the same in accordance with an embodiment of the present disclosure.
Figure 4:
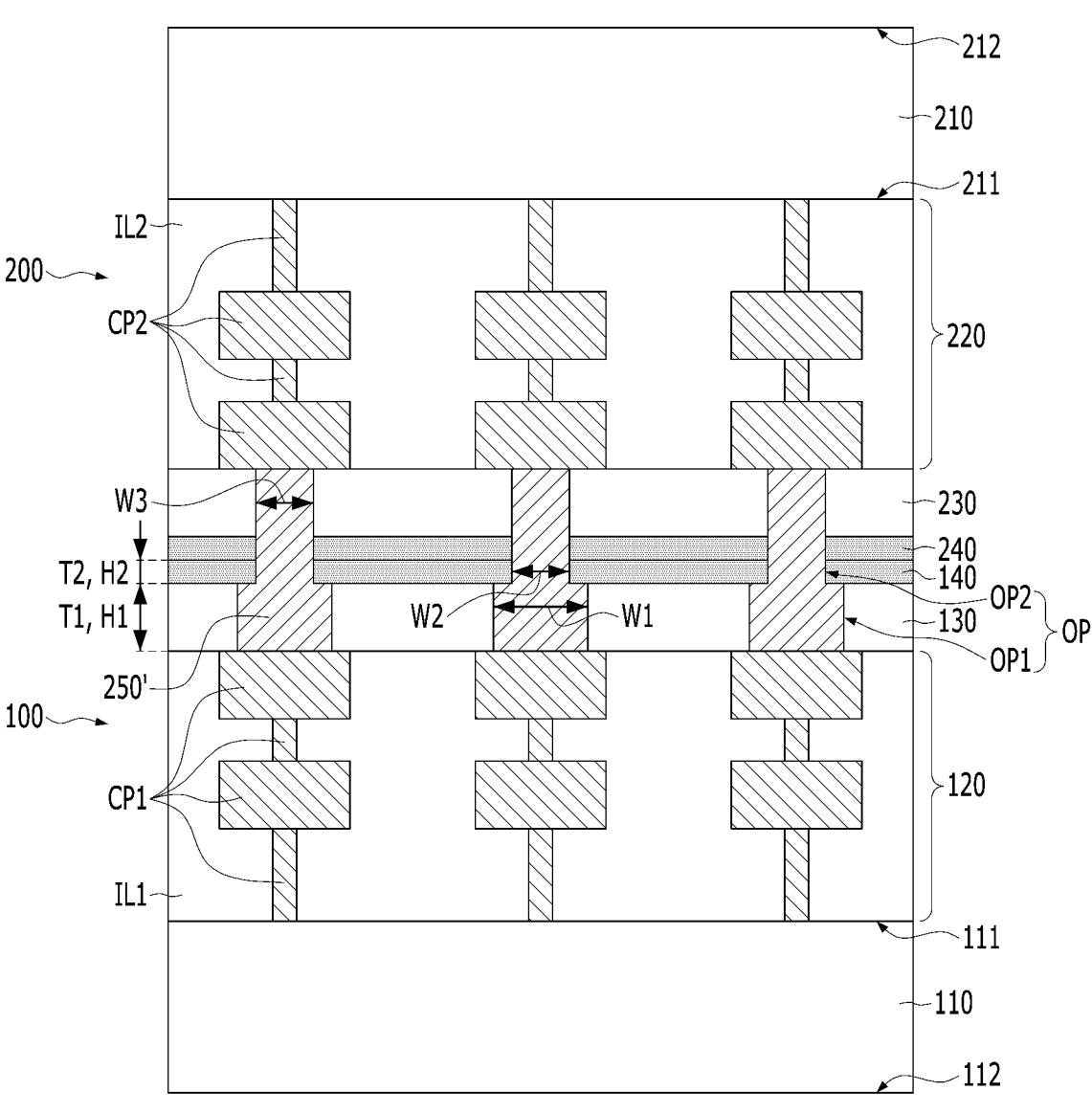

FIGS. 3 and 4 are cross-sectional views illustrating a semiconductor device and a method for fabricating the same in accordance with an embodiment of the present disclosure. FIG. 4 shows the semiconductor device in accordance with an embodiment of the present disclosure. FIG. 3 shows an intermediate process step for fabricating the semiconductor device shown in FIG. 4.

Referring to FIG. 3, the second semiconductor structure 200 may be positioned over the first semiconductor structure 100. Here, compared to what is illustrated in FIG. 2D, the second semiconductor structure 200 may be different in that the second semiconductor structure 200 is positioned in a vertically inverted state. In other words, the second semiconductor structure 200 may be positioned over the first semiconductor structure 100 with the front surface 211 facing downward and the rear surface 212 facing upward. As a result, the front surface 111 of the first semiconductor structure 100 and the front surface 211 of the second semiconductor structure 200 may face each other.

In this state, the protruding portion 250A of the initial bonding pad 250 of the second semiconductor structure 200 may be inserted into the opening OP of the first semiconductor structure 100 (see the arrow). As described above, since the third width W3 of the initial bonding pad 250 has a value equal to or less than the second width W2 of the second opening OP2, the insertion may be easily performed. Also, the third height H3 of the protruding portion 250A of the initial bonding pad 250 may have a value equal to or greater than the sum of the first and second heights H1 and H2 of the first and second openings OP1 and OP2. This is because when the third height H3 of the protruding portion 250A of the initial bonding pad 250 is less than the sum of the first and second heights H1 and H2 of the first and second openings OP1 and OP2, the protruding portion 250A of the initial bonding pad 250 may not sufficiently fill the opening OP, which may result in excessively large voids. Except for a condition that the third width W3 is equal to or less than the second width W2 and the third height H3 is equal to or greater than the sum of the first and second heights H1 and H2, the specific values or relationships between the first to third widths W1, W2 and W3 and the first to third heights H1, H2 and H3 may not be limited in the present disclosure. As long as the protruding portions 250A may sufficiently fill the corresponding openings OP, the first to third widths W1, W2 and W3 and the first to third heights H1, H2 and H3 may be adjusted diversely. For example, as the first width W1 increases, at least one among the third width W3 and the third height H3 may increase.

In a state that the protruding portions 250A of the initial bonding pads 250 of the second semiconductor structure 200 are inserted into the opening OP of the first semiconductor structure 100, when a high-temperature annealing process is performed while applying force so that the first bonding dielectric layer 140 and the second bonding dielectric layer 240 contact each other, the first semiconductor structure 100 and the second semiconductor structure 200 may be bonded. The result is as shown in FIG. 4.

Referring to FIG. 4, the first bonding dielectric layer 140 and the second bonding dielectric layer 240 may form an insulator-to-insulator bonding by a covalent bonding between dielectric materials. Also, the shape of the protruding portion 250A of the initial bonding pad 250 may be deformed in such a manner that the shape of the protruding portion 250A may fill the opening OP by the force and/or heat applied during the bonding process. This is because the metal forming the initial bonding pad 250 has a ductility capable of shape deformation by force and/or heat. The rest of the initial bonding pad 250 except for the protruding portion 250A may maintain its shape. As a result, a bonding pad 250' having the first width W1, the second width W2, and the third width W3 may be formed. A portion of the bonding pad 250' passing through the second dielectric layer 230 and the second bonding dielectric layer 240 may have the third width W3. A portion of the bonding pad 250' buried in the second opening OP2, that is, a portion passing through the first bonding dielectric layer 140, may have the second width W2. A portion of the bonding pad 250' buried in the first opening OP1, that is, a portion passing through the first dielectric layer 130 may have the first width W1. For the sake of convenience in description, portions of the bonding pad 250' having the first width W1, the second width W2, and the third width W3 are referred to as a first portion, a second portion, and a third portion, respectively. It may be considered that the third portion of the bonding pad 250' passing through the second dielectric layer 230 and the second bonding dielectric layer 240 corresponds to the bonding pad of the second semiconductor structure 200 and the first and second portions buried in the opening OP correspond to the bonding pad of the first semiconductor structure 100.

According to the semiconductor device and the fabrication method thereof which are described above, the following advantages may be obtained.

First, the width of the bonding pad 250' at the bonding interface may be relatively small. In other words, the second width W2 of the portion passing through the first bonding dielectric layer 140 and the third width W3 of the portion passing through the second bonding dielectric layer 240 of the bonding pad 250' may have a value that is substantially the same and smaller than the first width W1. In this case, the contact area between the first bonding dielectric layer 140 and the second bonding dielectric layer 240 may be widened at the bonding interface, so bonding characteristics may be improved. This is because there is a strong bonding force between the first bonding dielectric layer 140 and the second bonding dielectric layer 240 due to a covalent bonding between dielectric materials.

Also, the area or volume occupied by the bonding pad 250' may be increased by making the first width W1 of the portion passing through the first dielectric layer 130 of the bonding pad 250' larger than the second width W2 and the third width W3. The increase in the area or volume occupied by the bonding pad 250' means an increase in the area or volume occupied by a metal. In this case, the resistance of the electrical path may decrease as heat dissipation characteristics through the bonding pad 250' are improved.

Furthermore, typically, the first bonding pad of the first semiconductor structure and the second bonding pad of the second semiconductor structure were formed separately. In other words, when the first semiconductor structure is formed, the first bonding pad may be formed by burying a metal material in the bonding dielectric layer and performing a Chemical Mechanical Polishing (CMP) process, and when the second semiconductor structure is formed, the second bonding pad may be formed by burying a metal material in the bonding dielectric layer and performing a CMP process. In this case, since dishing or erosion in which the metal material is depressed during the CMP occurs, it may be difficult to connect the first bonding pad to the second bonding pad. On the other hand, according to the embodiment of the present disclosure, the bonding pads are not separately formed in each of the first semiconductor structure 100 and the second semiconductor structure 200, but formed by burying some of the initial bonding pads 250 formed in the second semiconductor structure 200 in the opening OP of the first semiconductor structure 100. Therefore, the problem of poor connection between the bonding pads may be prevented from the very source.

In the semiconductor device of the above embodiment of the present disclosure, voids may be formed while the protruding portion 250A of the initial bonding pad 250 is buried in the opening OP. This is shown in FIG. 5.

Figure 5:
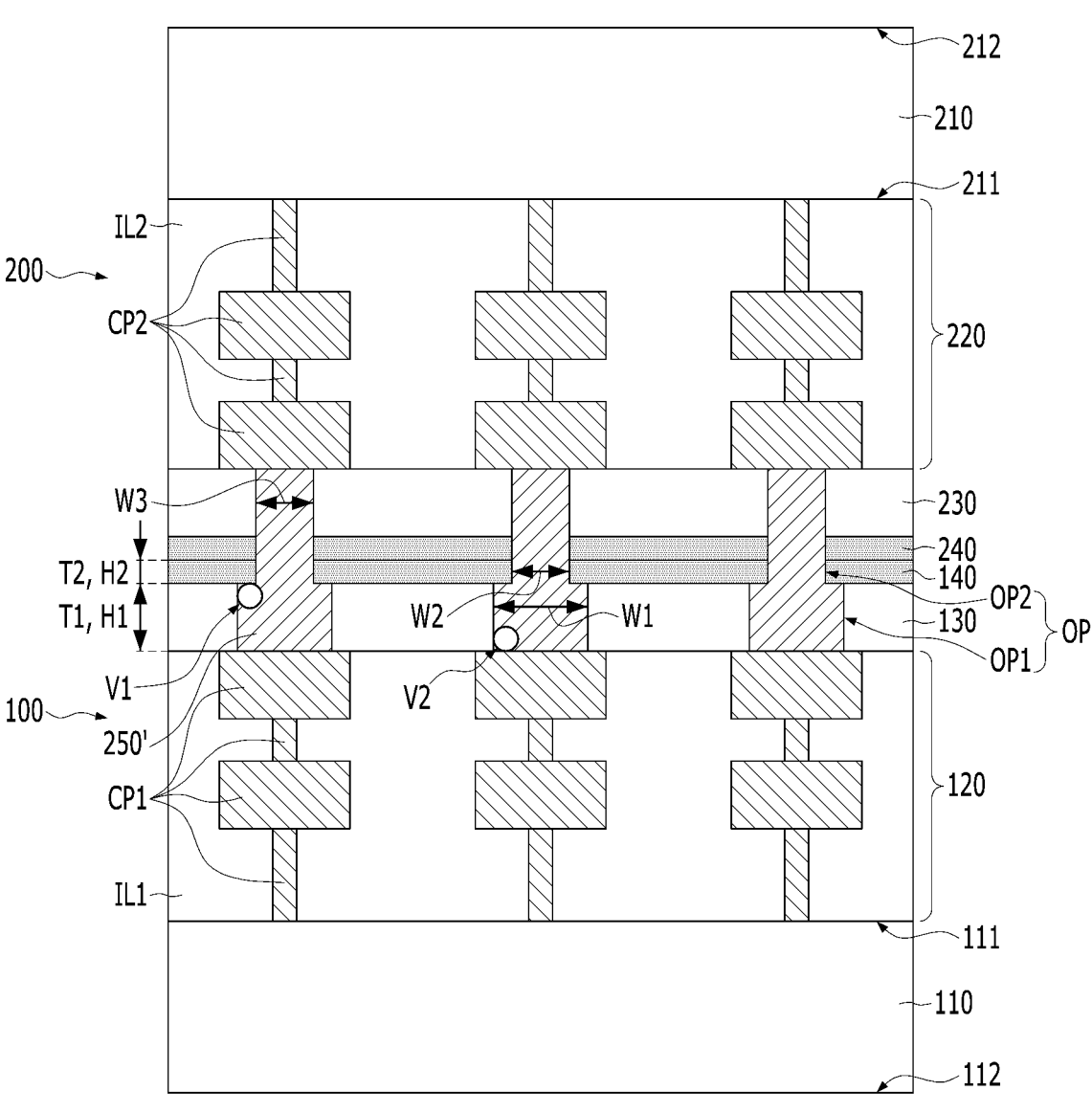
FIG. 5 is a cross-sectional view illustrating a semiconductor device in accordance with another embodiment of the present disclosure.

FIG. 5 is a cross-sectional view illustrating a semiconductor device in accordance with another embodiment of the present disclosure. This embodiment of the present disclosure is described mainly focusing on the differences from what is described in the foregoing embodiment, and the constituent elements that are substantially the same as those of the foregoing embodiment will be denoted by the same reference numerals, and detailed descriptions on them will be omitted.

Referring to FIG. 5, voids V1 and V2 may be formed in the first portion of the bonding pad 250' which is buried in the first opening OP1. This may occur when the metal buried in the first opening OP1 does not sufficiently fill the first opening OP1. Accordingly, the voids V1 and V2 may be positioned adjacent to the boundary of the first opening OP1. For example, the first void V1 may be formed in a corner region which is adjacent to a side surface of the first dielectric layer 130 corresponding to a side surface of the first opening OP1 and also adjacent to the first bonding dielectric layer 140. Also, the second void V2 may be formed in a corner region which is adjacent to a side surface of the first dielectric layer 130 corresponding to a side surface of the first opening OP1 and adjacent to the uppermost conductive pattern of the first circuit zone 120. These first and second voids V1 and V2 may be movable.

The voids V1 and V2 may not be formed in the remaining portions of the bonding pad 250', that is, the second portion and the third portion. Also, even though voids that are not illustrated are formed in the second and third portions of the bonding pad 250', the density and/or size of the voids may be smaller than the density and/or size of the voids V1 and V2 in the first portion.

Meanwhile, although a process of bonding the first semiconductor structure 100 and the second semiconductor structure 200 in a state that the second semiconductor structure 200 is positioned over the first semiconductor structure 100 is described in FIGS. 3 and 4, there may be other embodiments. In other words, the first semiconductor structure 100 and the second semiconductor structure 200 may be bonded in a state that the first semiconductor structure 100 is positioned over the second semiconductor structure 200. This will be described below with reference to FIGS. 6 and 7.

Figure 6:
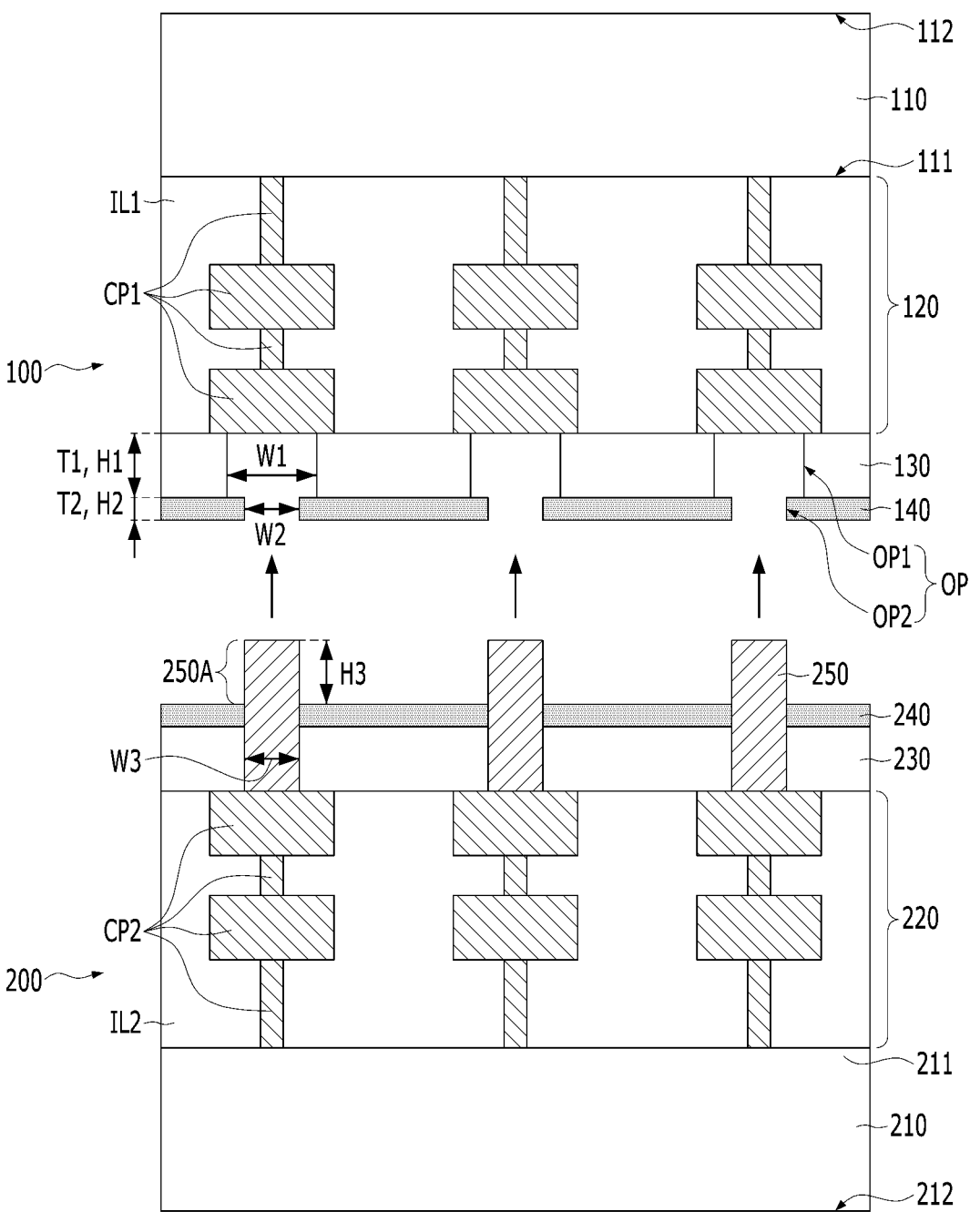
FIGS. 6 and 7 are cross-sectional views illustrating a semiconductor device and a method for fabricating the same in accordance with another embodiment of the present disclosure.
Figure 7:
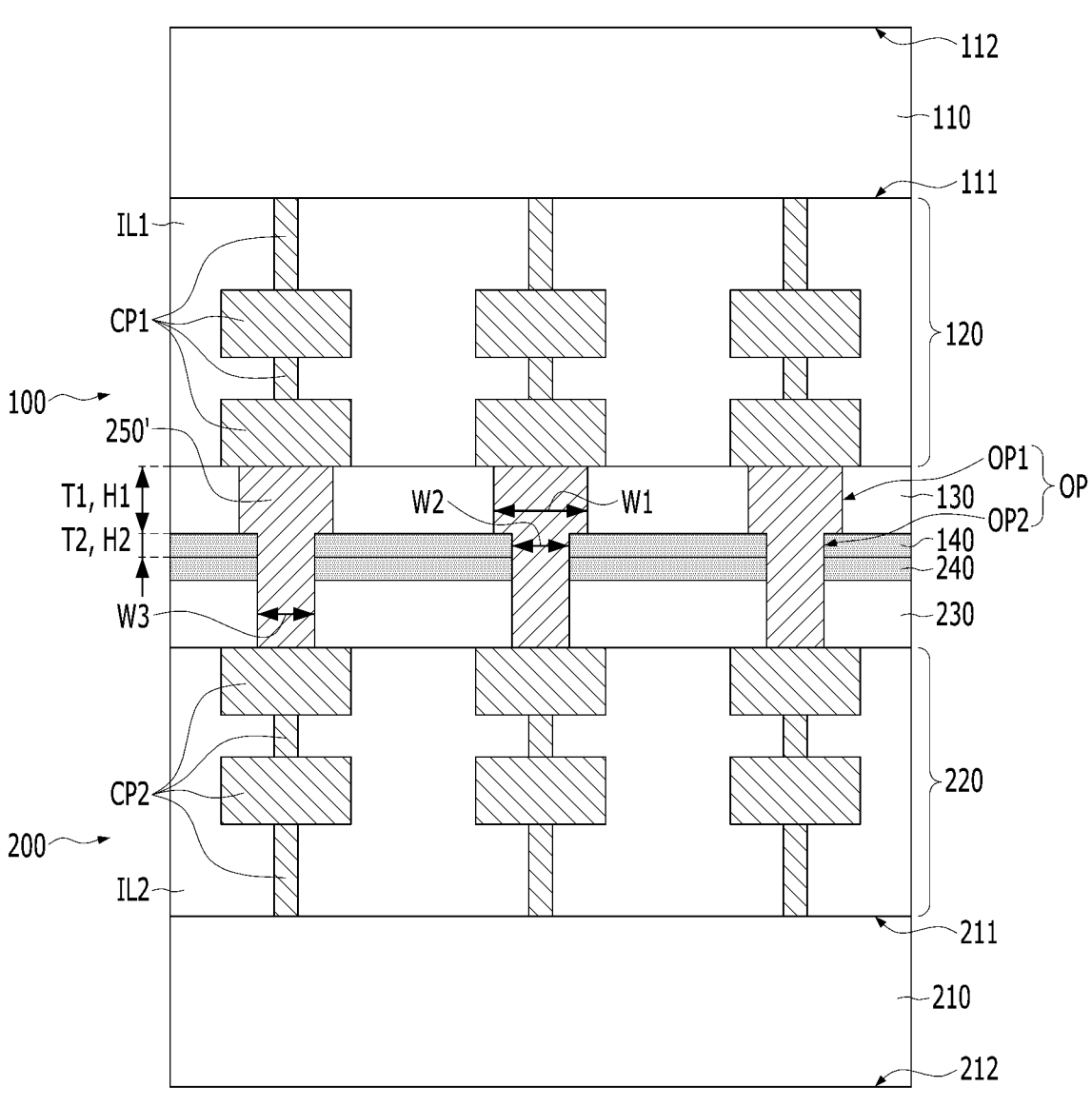

FIGS. 6 and 7 are cross-sectional views illustrating a semiconductor device and a method for fabricating the same in accordance with another embodiment of the present disclosure. FIG. 7 shows the semiconductor device in accordance with the embodiment of the present disclosure, and FIG. 6 shows an intermediate process step for fabricating the semiconductor device shown in FIG. 7. This embodiment of the present disclosure is described mainly focusing on the differences from what is described in the foregoing embodiment, and the constituent elements that are substantially the same as those of the foregoing embodiment will be denoted by the same reference numerals, and detailed descriptions on them will be omitted.

Referring to FIG. 6, the first semiconductor structure 100 may be positioned over the second semiconductor structure 200. Here, compared to what is illustrated in FIG. 1D, the first semiconductor structure 100 may be positioned in a vertically inverted state. In other words, the first semiconductor structure 100 may be positioned over the second semiconductor structure 200 with the front surface 111 facing downward and the rear surface 112 facing upward. As a result, the front surface 111 of the first semiconductor structure 100 and the front surface 211 of the second semiconductor structure 200 may face each other.

In this state, the protruding portion 250A of the initial bonding pad 250 of the second semiconductor structure 200 may be inserted into the opening OP of the first semiconductor structure 100 (see the arrow). In a state that the protruding portion 250A of the initial bonding pad 250 of the second semiconductor structure 200 is inserted into the opening OP of the first semiconductor structure 100, when a high-temperature annealing process is performed while applying force so that the first bonding dielectric layer 140 and the second bonding dielectric layer 240 contact each other, the first semiconductor structure 100 and the second semiconductor structure 200 may be bonded, and the result is as shown in FIG. 7.

Referring to FIG. 7, the first bonding dielectric layer 140 and the second bonding dielectric layer 240 may form an insulator-to-insulator bonding by a covalent bonding between dielectric materials. Also, the shape of the protruding portion 250A of the initial bonding pad 250 may be deformed to fill the opening OP by force and/or heat that is applied during the bonding process, and as a result, the bonding pad 250' may be formed.

Even according to this embodiment of the present disclosure, all of the advantages that are described above in the foregoing embodiment can also be obtained.

According to the embodiment of the present disclosure, it is possible to provide a semiconductor device that may have improved bonding characteristics and heat dissipation characteristics through bonding pads by adopting a structure of coupling two semiconductor structures with the bonding pads and that may be capable of preventing a defect in coupling the bonding pads by reducing the resistance of an electrical path through the bonding pads, and a method for fabricating the semiconductor device.

While the present disclosure has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   providing a first semiconductor structure including a stacked structure of a first dielectric layer and a first bonding dielectric layer, and including a first opening having a first width in the first dielectric layer and a second opening having a second width smaller than the first width in the first bonding dielectric layer, and overlapping with the first opening;
   providing a second semiconductor structure including a stacked structure of a second dielectric layer and a second bonding dielectric layer, and an initial bonding pad passing through the second dielectric layer and the second bonding dielectric layer while having a protruding portion which protrudes from the second bonding dielectric layer; and
   bonding the first bonding dielectric layer and the second bonding dielectric layer while inserting the protruding portion into the first and second openings.

2. The method of claim 1, wherein, in the bonding of the first bonding dielectric layer and the second bonding dielectric layer, a shape of the protruding portion is deformed to fill the first and second openings.

3. The method of claim 2, wherein the deformed protruding portion includes one or more voids.

4. The method of claim 2, wherein a density or size of the voids of the deformed protruding portion is greater than a density or size of voids of a remaining portion of the initial bonding pad, except for the protruding portion of the initial bonding pad.

5. The method of claim 1, wherein a third width of the protruding portion is equal to or less than the second width.

6. The method of claim 5, wherein a remaining portion of the initial bonding pad, except for the protruding portion of the initial bonding pad, has the third width.

7. The method of claim 1, wherein a height of the protruding portion is equal to or greater than a sum of a height of the first opening and a height of the second opening.

8. The method of claim 1, wherein the bonding of the first bonding dielectric layer and the second bonding dielectric layer includes:

performing an annealing process to form a covalent bond between a dielectric material of the first bonding dielectric layer and a dielectric material of the second bonding dielectric layer.

9. The method of claim 1, wherein the bonding of the first bonding dielectric layer and the second bonding dielectric layer is performed in a state that the first semiconductor structure is positioned over the second semiconductor structure.

10. The method of claim 1, wherein the bonding of the first bonding dielectric layer and the second bonding dielectric layer is performed in a state that the second semiconductor structure is positioned over the first semiconductor structure.

11. The method of claim 1, wherein the providing of the first semiconductor structure includes:

forming the first dielectric layer having a first sacrificial pattern over a first semiconductor substrate;

forming the first bonding dielectric layer having a second sacrificial pattern over the first dielectric layer; and forming the first opening and the second opening by removing the first sacrificial pattern and the second sacrificial pattern.

12. The method of claim 1, wherein the providing of the second semiconductor structure includes:

sequentially forming the second dielectric layer, the second bonding dielectric layer, and a sacrificial layer over the second semiconductor substrate;

providing a space where the initial bonding pad is to be formed by selectively etching the sacrificial layer, the second bonding dielectric layer, and the second dielectric layer;

filling the space with a conductive material to form the initial bonding pad; and removing the sacrificial layer.

* * * * *